(12) United States Patent
Nakaminato et al.

(10) Patent No.: US 9,396,788 B1
(45) Date of Patent: Jul. 19, 2016

(54) INFORMATION PROCESSING APPARATUS AND INFORMATION PROCESSING METHOD

(71) Applicant: FUJI XEROX CO., LTD., Tokyo (JP)

(72) Inventors: Tsutomu Nakaminato, Kanagawa (JP);
Yoshinobu Terui, Kanagawa (JP);
Tomokazu Kaneko, Kanagawa (JP);
Katsuma Nakamoto, Kanagawa (JP);
Yoshitaka Terui, Kanagawa (JP);
Asahito Shioyasu, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 14/810,620

(22) Filed: Jul. 28, 2015

(30) Foreign Application Priority Data

Jan. 22, 2015 (JP) ................................. 2015-010579

(51) Int. Cl.
*G11C 7/00* (2006.01)
*G11C 11/4076* (2006.01)
*G11C 11/406* (2006.01)
*G11C 11/4074* (2006.01)

(52) U.S. Cl.
CPC ........ *G11C 11/4076* (2013.01); *G11C 11/4074* (2013.01); *G11C 11/40615* (2013.01); *G11C 11/406* (2013.01)

(58) Field of Classification Search
CPC ............. G11C 11/406; G11C 11/4074; G11C 11/4076; G11C 11/40615
USPC ........................ 365/222, 233.1, 227, 228, 229
See application file for complete search history.

(56) References Cited

U.S. PATENT DOCUMENTS

| 5,469,386 | A | * | 11/1995 | Obara | G11C 11/4076 365/185.21 |
| 2002/0184438 | A1 | * | 12/2002 | Usui | G11C 11/406 711/106 |
| 2010/0232247 | A1 | * | 9/2010 | Yamasaki | G06F 1/3203 365/222 |

FOREIGN PATENT DOCUMENTS

| JP | 2006-350859 A | 12/2006 |
| JP | 2010-269496 A | 12/2010 |

* cited by examiner

*Primary Examiner* — Tan T. Nguyen
(74) *Attorney, Agent, or Firm* — Sughrue Mion, PLLC

(57) ABSTRACT

An information processing apparatus includes a memory that is volatile, a memory controller connected to the memory in an information exchangeable manner, and a clock enable (CKE) controller. The CKE controller controls a CKE signal in response to a request for a proxy in self-refresh control, the CKE signal being transmitted from the memory controller to the memory and being controlled to be kept low until cancellation of the proxy is requested. At a time of shifting to a power-saving mode, the memory controller stores information held by a central processing unit (CPU) in the memory and causes the memory to shift to a self-refresh mode. At a time of recovery from the power-saving mode, the memory controller requests the CKE controller for the cancellation of the proxy in the self-refresh control and thereafter cancels the self-refresh mode of the memory.

3 Claims, 3 Drawing Sheets

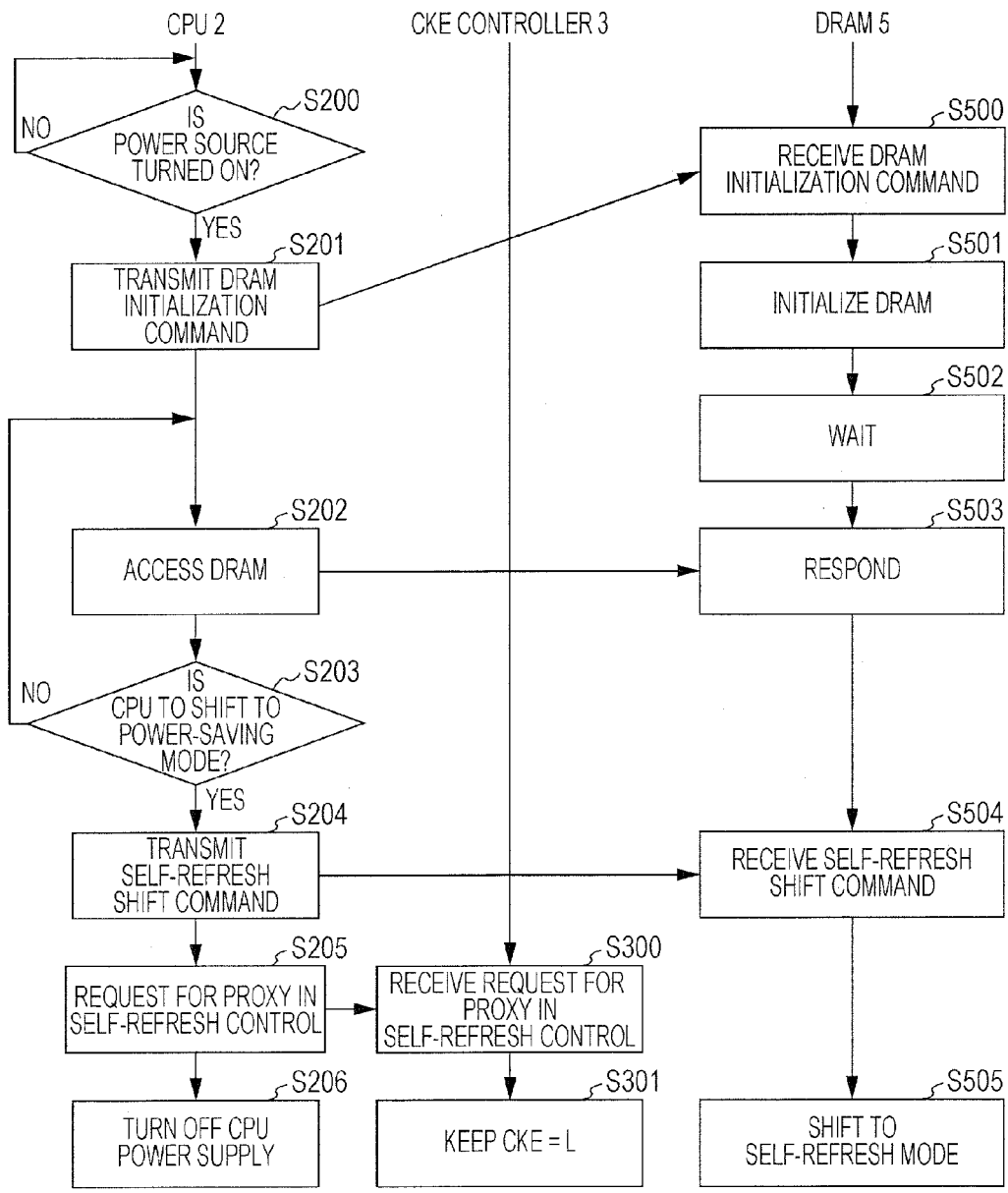

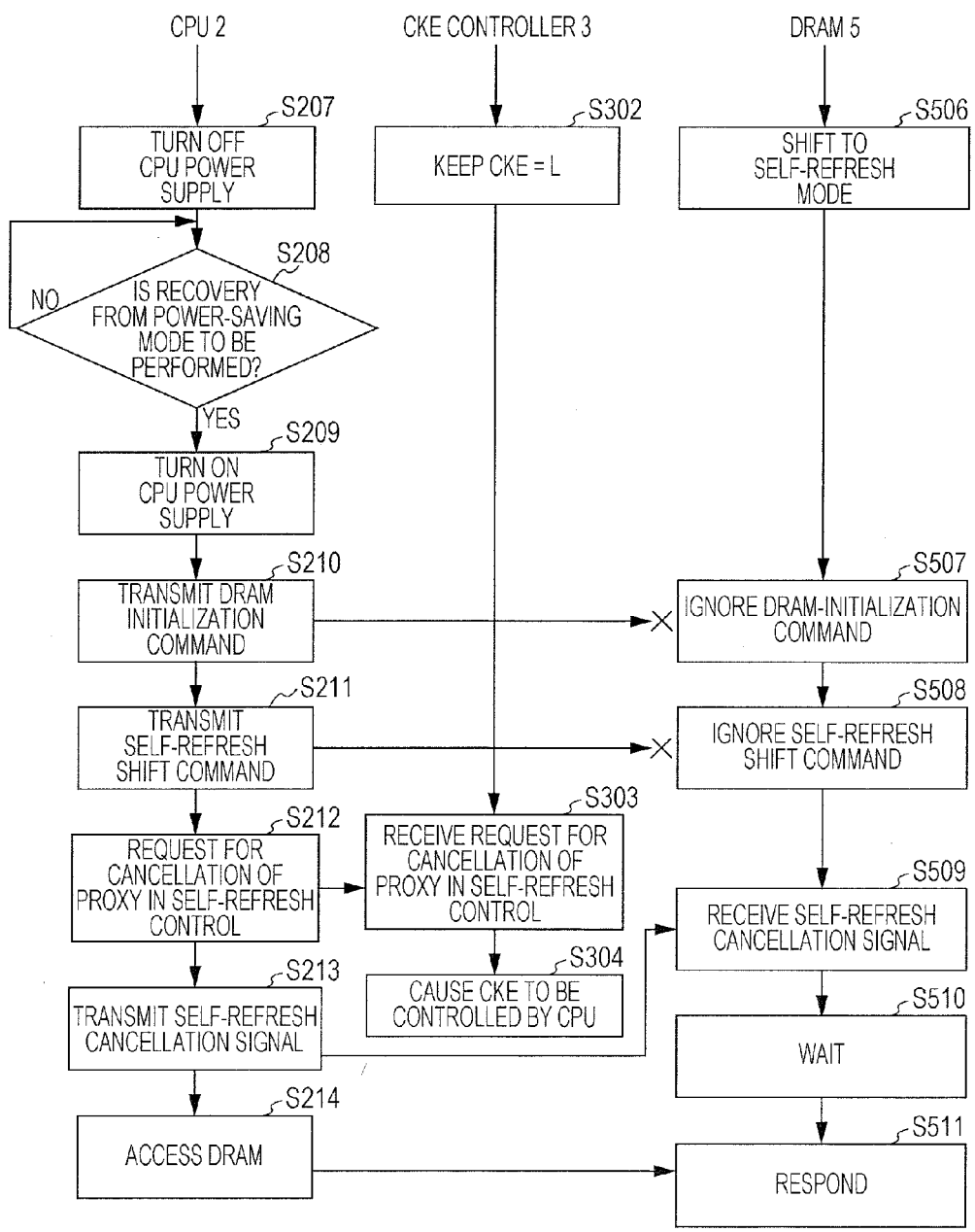

INFORMATION PROCESSING APPARATUS AND INFORMATION PROCESSING METHOD

CROSS-REFERENCE TO RELATED APPLICATIONS

This application is based on and claims priority under 35 USC 119 from Japanese Patent Application No. 2015-010579 filed Jan. 22, 2015.

BACKGROUND

Technical Field

The present invention relates to an information processing apparatus and an information processing method.

SUMMARY

According to an aspect of the invention, there is provided an information processing apparatus including a memory that is volatile, a memory controller connected to the memory in an information exchangeable manner, and a clock enable (CKE) controller. The CKE controller controls a CKE signal in response to a request for a proxy in self-refresh control, the CKE signal being transmitted from the memory controller to the memory and being controlled to be kept low until cancellation of the proxy is requested. At a time of shifting to a power-saving mode, the memory controller stores information held by a central processing unit (CPU) in the memory and causes the memory to shift to a self-refresh mode. At a time of recovery from the power-saving mode, the memory controller requests the CKE controller for the cancellation of the proxy in the self-refresh control and thereafter cancels the self-refresh mode of the memory.

BRIEF DESCRIPTION OF THE DRAWINGS

Exemplary embodiments of the present invention will be described in detail based on the following figures, wherein:

FIG. 2 is a flowchart illustrating how the information processing apparatus operates after power-on and at the time of shifting to a power-saving mode; and FIG. 3 is a flowchart illustrating how the information processing apparatus operates to recover from a power-saving mode.

DETAILED DESCRIPTION

Exemplary Embodiment

Configuration of Information Processing Apparatus

Figure 1:
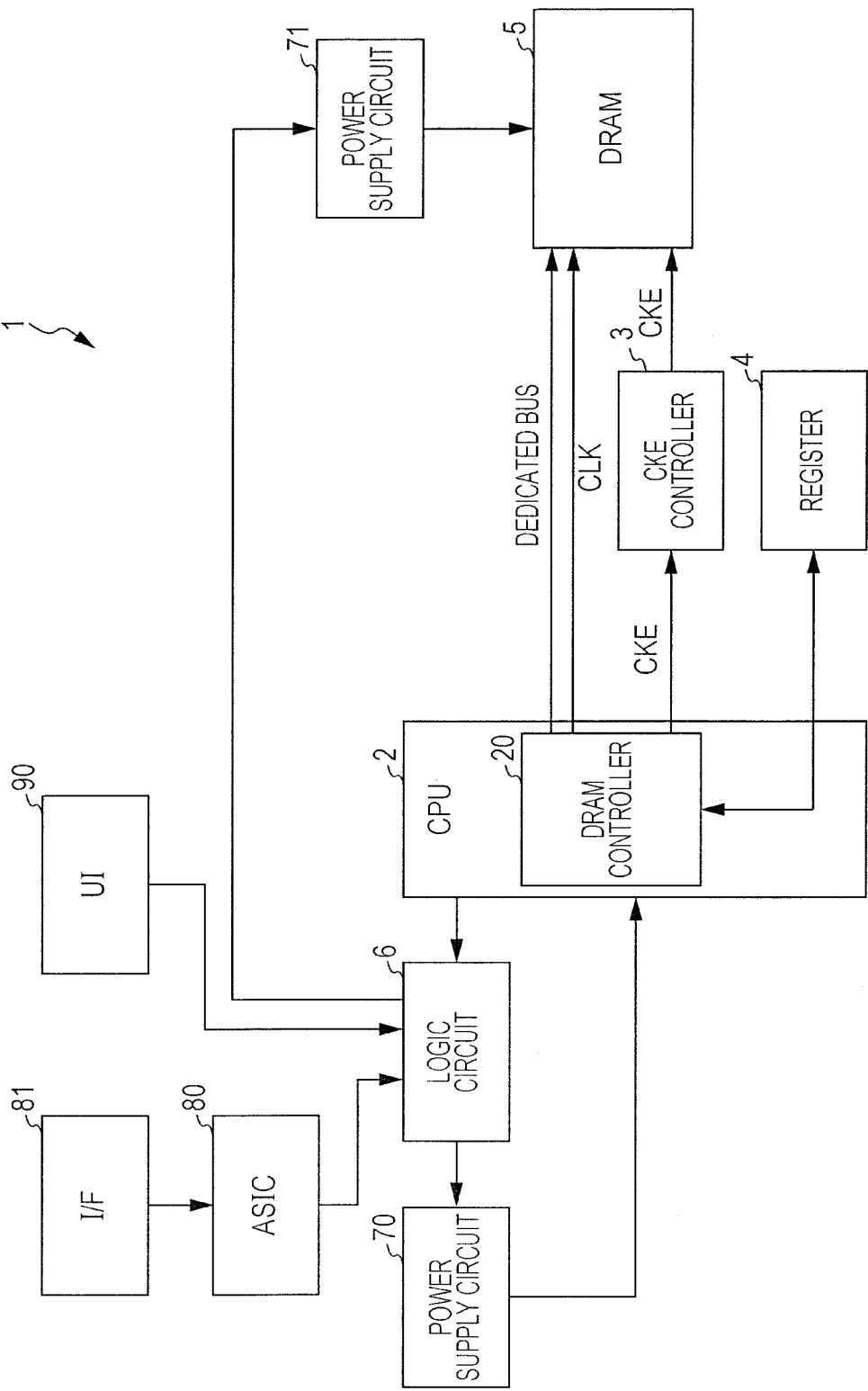
FIG. 1 is a block diagram illustrating a configuration example of an information processing apparatus according to an exemplary embodiment.

FIG. 1 is a block diagram illustrating a configuration example of an information processing apparatus according to an exemplary embodiment.

An information processing apparatus 1 includes a central processing unit (CPU) 2, a clock enable (CKE) controller 3, a register 4, a dynamic random access memory (DRAM) 5, a logic circuit 6, power supply circuits 70 and 71, an application specific integrated circuit (ASIC) 80, an interface (I/F) 81, and a user interface (UI) 90.

The CPU 2 includes a DRAM controller 20. The CPU 2 is connected, in such a manner as to allow data and signals to be exchanged, to the logic circuit 6, to the power supply circuits 70 and 71 via the logic circuit 6 and to the DRAM 5 via the DRAM controller 20. Note that the DRAM controller 20 is connected to the DRAM 5 through a clock (CLK) signal line for clock signal transmission, a CKE signal line for CKE signal transmission, and a dedicated bus for data transmission and reception in a data exchangeable manner. The CPU 2 controls the entire information processing apparatus 1.

The CKE controller 3 is disposed on the CKE signal line between the DRAM controller 20 and the DRAM 5. The CKE controller 3 controls transmission of a CKE signal from the DRAM controller 20 to the DRAM 5 in such a manner as to either allow the CKE signal to pass through the CKE controller 3 to the DRAM 5 or keep the CKE signal to be transmitted to the DRAM 5 at a low level regardless of the level of the CKE signal transmitted from the DRAM controller 20. While the CKE signal is being kept at the low level, a self-refresh operation in which refreshing is automatically performed in the memory is continued in the DRAM 5. When the CKE signal is switched to a high level, the self-refresh mode is cancelled, and refreshing is performed in the DRAM 5 in accordance with a clock signal transmitted from the DRAM controller 20.

The register 4 is a circuit for storing information indicating that the CPU 2 is in a power-saving mode. The register 4 is connected to the DRAM controller 20 in a data exchangeable manner.

The CKE controller 3 and the register 4 are formed as, for example, a complex programmable logic device (CPLD).

The DRAM 5 is used as a main memory, and data necessary for various processes performed by the CPU 2 is stored in the DRAM 5. The DRAM 5 is a volatile memory, and the mode thereof is switched between a self-refresh mode and a normal operation mode under the control of the DRAM controller 20. In the self-refresh mode, refreshing is automatically performed in the DRAM 5 at appropriate refresh intervals. In the normal operation mode, refreshing is performed under the control of the DRAM controller 20.

When the DRAM 5 enters the self-refresh mode, refreshing is automatically performed at appropriate refresh intervals in the DRAM 5. A high-level CKE signal corresponds to output of a cancellation signal for cancelling the self-refresh mode. A low-level CKE signal corresponds to output of a self-refresh designation signal for designating shifting to the self-refresh mode.

A case where a volatile memory used as a main memory is a DRAM will be described in the present exemplary embodiment, but the volatile memory may be a volatile memory of another type.

The UI 90 is connected to the logic circuit 6 in a signal exchangeable manner and includes a designation button used by a user for designating recovery from the power-saving mode. Further, the logic circuit 6 is connected to the ASIC 80 and the I/F 81 that are controllable for recovery from power-saving mode, and the I/F 81 is provided for exchanging data and signals with an external device through a network.

The power supply circuit 70 supplies power to units including the CPU 2 and the DRAM controller 20 of the information processing apparatus 1 and is connected to the logic circuit 6 in a signal exchangeable manner. The power supply circuit 70 is controlled by the logic circuit 6 with respect to the power supply to and power disconnection from the units including the CPU 2 and the DRAM controller 20.

The power supply circuit 71 supplies power to the DRAM 5 and is connected to the logic circuit 6 in a signal exchangeable manner. The power supply circuit 71 is controlled by the logic circuit 6 with respect to the power supply to and power disconnection from the DRAM 5.

Operation of Information Processing Apparatus

Next, (1) Power-on and Power-saving-mode Shifting Operation and (2) Recovery Operation will be described as effects of the present exemplary embodiment.

(1) Power-On and Power-Saving-Mode Shifting Operation

FIG. 2 is a flowchart illustrating how the information processing apparatus 1 operates after power-on and at the time of shifting to a power-saving mode. Note that FIG. 2 illustrates the CPU 2 to represent operations of the CPU 2 and the DRAM controller 20.

If the CPU 2 determines that the power source of the information processing apparatus 1 is turned on in response to a power supply from the power supply circuit 70 under the control of the logic circuit 6 (S200: YES), the CPU 2 instructs the DRAM controller 20 to transmit a command for initializing the DRAM 5 (S201). The DRAM controller 20 transmits the DRAM initialization command to the DRAM 5 through the dedicated bus.

Upon receiving the DRAM initialization command (S500), the DRAM 5 performs initialization (S501) and waits for a signal from the CPU 2 (S502).

After the DRAM 5 is initialized and enters the standby mode, the CPU 2 executes various processes and accesses the DRAM 5 as necessary (S202).

Meanwhile, the DRAM 5 operates in response to the access by the CPU 2 (S503).

If the CPU 2 determines that the CPU 2 is to shift to the power-saving mode (S203: YES), the CPU 2 outputs a power-saving designation signal indicating designation of switching to the power-saving mode to the logic circuit 6 and the DRAM controller 20. The CPU 2 also writes information set in the DRAM controller 20 to the DRAM 5. The DRAM controller 20 transmits the self-refresh shift command to the DRAM 5 (S204).

Note that the CPU 2 determines whether to shift to the power-saving mode on the basis of, for example, an application or input, of the power-saving designation signal indicating switching to the power-saving mode, received from an external device through the UI 90 and the network.

An operation designated by the self-refresh shift command includes an operation of writing the refresh intervals currently set in the DRAM controller 20 to the DRAM 5 through the dedicated bus.

The self-refresh shift command is implemented when the DRAM controller 20 asserts a CKE signal (performs control to set the CKE signal at a low level) through the CKE signal line. When receiving the self-refresh shift command (S504), that is, when receiving the CKE signal set at the low level, the DRAM 5 shifts to the self-refresh mode (S505 and S506) and the self-refresh operation is performed in which refreshing is automatically performed in the DRAM 5.

After step S204, the CPU 2 requests the CKE controller 3 to act as a proxy in the self-refresh control (S205). The CPU 2 stores information indicating the power-saving mode in the register 4.

Upon receiving the request for the proxy in the self-refresh control (S300), the CKE controller 3 keeps the CKE signal to be input to the DRAM 5 at the low level (S301). In other words, while being acting as a proxy in the self-refresh control, the CKE controller 3 keeps the CKE signal to be input to the DRAM 5 at the low level even if the CKE signal from the DRAM controller 20 is switched to the high level.

The power-saving designation signal output from the CPU 2 to the DRAM controller 20 before step S204 is also output to the logic circuit 6. The logic circuit 6 controls the power supply circuit 70 in such a manner that power supplied by the power supply circuit 70 to the units including the CPU 2 and the DRAM controller 20 is disconnected a predetermined time after the CPU 2 inputs the power-saving designation signal indicating designation of switching to the power-saving mode. As the predetermined time, a time required for the DRAM controller 20 to perform step S205 in FIG. 2 is measured in advance, and the measured time or a time longer than the measured time is used.

Accordingly, after the DRAM controller 20 performs steps S204 and S206, power supply to the units including the CPU 2 and the DRAM controller 20 of the information processing apparatus 1 is disconnected under the control of the power supply circuit 70 performed by the logic circuit 6 (S206 and S207). In other words, power supply to the units of the information processing apparatus 1 other than the DRAM 5 and the register 4 to which power is supplied by the power supply circuit 71 is disconnected, and the information processing apparatus 1 shifts to the power-saving mode.

(2) Recovery Operation

Next, an operation of recovery from the power-saving mode will be described.

FIG. 3 is a flowchart illustrating how the information processing apparatus 1 operates to recover from the power-saving mode. Note that FIG. 3 illustrates the CPU 2 to represent operations of the CPU 2 and the DRAM controller 20.

When the logic circuit 6 receives a recovery designation signal indicating designation of recovery from the power-saving mode (S208: YES), power is supplied from the power supply circuit 70 to the CPU 2 and the DRAM controller 20 under the control of the power supply circuit 70 performed by the logic circuit 6 (S209). Alternatively, the power may be supplied to the CPU 2 and the DRAM controller 20 when power is supplied to the units of the information processing apparatus 1 in accordance with a user operation of switching on a power switch (not illustrated). Note that the recovery designation signal indicating designation of recovery from the power-saving mode is input in accordance with a user operation of pressing a power-saving recovery designation button (not illustrated) included on the UI 90 or is input from the external device through the network.

In step S208, the CPU 2 determines whether information indicating the power-saving mode is stored in the register 4 to thereby determine whether the start of power supply to the CPU 2 and the DRAM controller 20 is attributable to recovery from the power-saving mode or recovery from a state where power supply to the entire information processing apparatus 1 is stopped due to a user operation of switching off the power switch (not illustrated).

When the power supply is started, the CPU 2 controls the DRAM controller 20 to transmit a DRAM initialization command to the DRAM 5 through the dedicated bus (S210).

The DRAM controller 20 also transmits the self-refresh shift command to the DRAM 5 (S211).

Note that since the CKE controller 3 keeps, at the low level, the CKE signal to be input to the DRAM 5 (S302), the DRAM 5 ignores the DRAM initialization command in step S210 (S507). In addition, since the CKE signal is at the low level at the time of transmitting the self-refresh shift command in step S211, the low level thereof is consistent with the low level of the CKE signal output by the CKE controller 3 (S508). In other words, the state of the DRAM 5 (self-refresh mode) is consistent with the CKE signal output by the DRAM controller 20.

Note that the operations in steps S210 and S211 are performed by a CPU that does not support an operation performed in response to recovery from the power-saving mode, whereas some CPUs are designed not to perform the operations and thus support the operation performed in response to recovery from the power-saving mode. Even though the operations are not performed, recovery from the power-saving mode may be performed in the present configuration.

Next, the DRAM controller 20 of the CPU 2 requests the CKE controller 3 to cancel the proxy in the self-refresh control (S212).

The CKE controller 3 receives the request for cancellation of the proxy in the self-refresh control from the DRAM controller 20 (S303) and causes the CKE signal to be controlled by the CPU 2 (S304). In other words, the CKE controller 3 allows the CKE signal output from the DRAM controller 20 to pass through the CKE controller 3 to the DRAM 5.

Next, the DRAM controller 20 negates the CKE signal (controls the CKE signal to switch to the high level) to thereby output a cancellation signal for cancelling the self-refresh mode to the DRAM 5 and thus cancels the self-refresh mode of the DRAM 5 (S213). When receiving the CKE signal switched to the high level, the DRAM 5 exits the self-refresh mode (S509) and becomes ready for reading and writing information under the control of the DRAM controller 20 (S510).

The DRAM controller 20 also clears the register 4.

When the power supply circuit 70 starts power supply, the CPU 2 acquires data stored in the DRAM 5 through the DRAM controller 20 and performs the operation of recovery from the power-saving mode and other operations (S214 and S511).

As described above, at the time of shifting to the power-saving mode, the DRAM controller 20 of the information processing apparatus 1 according to the present exemplary embodiment controls the DRAM 5 to cause the DRAM 5 to shift to the self-refresh mode after information set in the DRAM controller 20 is stored in the DRAM 5, and power supply to the DRAM controller 20 is disconnected after the information indicating the power-saving mode is stored in the register 4.

When power supply to the DRAM controller 20 is started, the DRAM controller 20 initializes the DRAM 5 regardless of whether the start is attributable to recovery from the power-saving mode. The DRAM controller 20 performs the operation of recovery from the power-saving mode on the basis of the information stored in the DRAM 5 after cancelling the self-refresh mode after causing the DRAM 5 to shift to the self-refresh mode, with an initial value of the CKE signal being undefined.

For the operation of recovery from the power-saving mode, the CKE controller 3 keeps the CKE signal at the low level to ignore the initialization of the DRAM 5 and shifting to the self-refresh mode. Subsequently, the CKE controller 3 allows the CKE signal to pass through the CKE controller 3 to cancel the self-refresh mode of the DRAM 5. The operation of recovery from the power-saving mode is then performed on the basis of the information stored in the DRAM 5. Accordingly, the DRAM 5 is not initialized in the case of recovery from the power-saving mode. This enables even a CPU designed to set a CKE initial value at a low level to reliably use information stored in the DRAM 5 at the time of recovery from the power-saving mode.

The CPU 2 stores the information indicating a state before shifting to the power-saving mode in the DRAM 5 and reads the information stored in the DRAM 5 at the time of recovery from the power-saving mode. The CPU 2 returns to the state before shifting to the power-saving mode in this manner. Accordingly, at the time of recovery from the power-saving mode, the CPU 2 may return to the state before shifting to the power-saving mode more quickly than in a case where a CPU stores information indicating the state before shifting to the power-saving mode in a non-volatile memory, reads the information from the non-volatile memory at the time of recovery from the power-saving mode, and returns to the state before shifting to the power-saving mode.

Other Exemplary Embodiments

Note that the exemplary embodiment of the invention is not limited to the aforementioned exemplary embodiment, and various modifications may be made without departing from the scope of the exemplary embodiment of the invention.

Mutual changes, deletions, additions, and the like of steps described above in the aforementioned exemplary embodiments may be made without departing from the gist of the present invention.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An information processing apparatus comprising:
a memory that is volatile;
a memory controller connected to the memory in an information exchangeable manner; and
a clock enable (CKE) controller that controls a CKE signal in response to a request for a proxy in self-refresh control, the CKE signal being transmitted from the memory controller to the memory and being controlled to be kept low until cancellation of the proxy is requested,
wherein at a time of shifting to a power-saving mode, the memory controller stores information held by a central processing unit (CPU) in the memory and causes the memory to shift to a self-refresh mode, and at a time of recovery from the power-saving mode, the memory controller requests the CKE controller for the cancellation of the proxy in the self-refresh control and thereafter cancels the self-refresh mode of the memory.

2. The information processing apparatus according to claim 1,
wherein before the memory controller requests the CKE controller for the cancellation of the proxy in the self-refresh control at the time of recovery from the power-saving mode, the memory controller transmits a command for initializing the memory and a command for causing the memory to shift to a self-refresh mode.

3. An information processing method comprising:
controlling a CKE signal in response to a request for a proxy in self-refresh control, the CKE signal being transmitted to a memory that is volatile from a memory controller connected to the memory in an information exchangeable manner, the CKE signal being controlled to be kept low until cancellation of the proxy is requested,
wherein at a time of shifting to a power-saving mode, information held by a CPU is stored in the memory, and the memory is caused to shift to a self-refresh mode, and at a time of recovery from the power-saving mode, the cancellation of the proxy in the self-refresh control is requested, and thereafter the self-refresh mode of the memory is cancelled.

\* \* \* \* \*